US006946718B2

(12) United States Patent
Chavarria

(10) Patent No.: US 6,946,718 B2
(45) Date of Patent: Sep. 20, 2005

(54) INTEGRATED FUSE FOR MULTILAYERED STRUCTURE

(75) Inventor: Victorio Chavarria, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/751,710

(22) Filed: Jan. 5, 2004

(65) Prior Publication Data

US 2005/0145982 A1 Jul. 7, 2005

(51) Int. Cl.$^{7}$ .............................................. H01L 29/00
(52) U.S. Cl. ............................ 257/529; 257/E23.149; 347/20; 347/59
(58) Field of Search ........................ 257/529, E23.149; 347/20, 59

(56) References Cited

U.S. PATENT DOCUMENTS

| | | | | |
|---|---|---|---|---|
| 3,576,549 A | | 4/1971 | Hess et al. | |
| 3,803,450 A | | 4/1974 | Trogdon | |
| 5,363,134 A | | 11/1994 | Barbehenn et al. | |
| 5,389,814 A | | 2/1995 | Srikrishnan et al. | |
| 5,414,245 A | | 5/1995 | Hackleman | |
| 5,445,694 A | | 8/1995 | Gillner et al. | |
| 5,457,059 A | * | 10/1995 | Keller et al. | 438/601 |
| 5,469,981 A | * | 11/1995 | Srikrishnan et al. | 216/13 |
| 5,471,163 A | | 11/1995 | Childers | |
| 5,508,724 A | | 4/1996 | Boyd et al. | |
| 5,585,662 A | * | 12/1996 | Ogawa | 257/529 |
| 5,585,663 A | * | 12/1996 | Bezama et al. | 257/529 |
| 5,635,968 A | | 6/1997 | Bhaskar et al. | |
| 5,793,095 A | | 8/1998 | Harvey | |
| 5,813,881 A | * | 9/1998 | Nathan et al. | 439/516 |
| 5,827,759 A | | 10/1998 | Froehner | |
| 5,871,826 A | | 2/1999 | Mei et al. | |
| 5,923,960 A | | 7/1999 | Harvey | |
| 6,150,916 A | | 11/2000 | Lin et al. | |
| 6,161,916 A | | 12/2000 | Gibson et al. | |
| 6,162,686 A | | 12/2000 | Huang et al. | |
| 6,180,503 B1 | | 1/2001 | Tzeng et al. | |
| 6,197,621 B1 | | 3/2001 | Harvey | |
| 6,259,146 B1 | | 7/2001 | Giust et al. | |
| 6,288,436 B1 | | 9/2001 | Narayan et al. | |
| 6,306,746 B1 | | 10/2001 | Haley et al. | |
| 6,368,902 B1 | | 4/2002 | Kothandaraman et al. | |
| 6,390,589 B1 | | 5/2002 | Imanaka et al. | |
| 6,403,403 B1 | | 6/2002 | Mayer et al. | |
| 6,423,582 B1 | | 7/2002 | Fischer et al. | |
| 6,479,308 B1 | | 11/2002 | Eldridge | |
| 6,495,901 B2 | | 12/2002 | Brintzinger et al. | |
| 6,512,284 B2 | | 1/2003 | Schulte et al. | |
| 6,549,690 B2 | | 4/2003 | Schulte et al. | |
| 6,558,969 B2 | | 5/2003 | Miller et al. | |
| 6,559,042 B2 | | 5/2003 | Barth et al. | |
| 6,559,973 B2 | | 5/2003 | Bullock et al. | |
| 6,562,674 B1 | | 5/2003 | Tsuura | |
| 6,566,730 B1 | | 5/2003 | Giust et al. | |
| 6,567,251 B1 | | 5/2003 | Schulte et al. | |
| 2003/0025177 A1 | | 2/2003 | Kothandaraman | |
| 2004/0085405 A1 | * | 5/2004 | Baek | 347/59 |

* cited by examiner

*Primary Examiner*—David Nelms
*Assistant Examiner*—Tu-Tu Ho

(57) ABSTRACT

A device includes a substrate and a first layer disposed adjacent the substrate. A second layer is disposed adjacent the first layer. A third layer contains a gap and is disposed adjacent the second layer. A fuse is electrically coupled to the third layer and is located in the proximity of the gap in the third layer.

22 Claims, 6 Drawing Sheets

INTEGRATED FUSE FOR MULTILAYERED STRUCTURE

TECHNICAL FIELD

The systems and methods discussed herein relate to integrated fuse structures.

BACKGROUND

Conventional fluid ejection systems, such as inkjet printing systems, include a printhead, an ink supply that provides liquid ink to the printhead, and an electronic controller that controls the printhead. The printhead ejects ink drops through multiple nozzles (also referred to as orifices) toward a print medium, such as a sheet of paper, thereby printing onto the print medium. Typically, the multiple nozzles are arranged in one or more arrays such that properly sequenced ejection of ink from the nozzles causes characters or other images to be printed on the print medium as the printhead and the print medium are moved relative to one another.

Certain fluid ejection devices contain one or more fuses as part of an integrated programmable read-only memory (PROM). The PROM is programmed by blowing (also referred to as "burning") one or more fuses contained in the PROM. The PROM can be programmed with a serial number associated with the fluid ejection device, a model number associated with the fluid ejection device, electrical calibration data, fluidic data, or other data.

It is desirable to provide a fluid ejection device having a structure that allows one or more fuses to be blown with reliable results during a fuse programming process. Also, it is desirable to have such fuse structures that have low likelihoods of undesired short circuits during normal operation.

SUMMARY

In one embodiment, a device includes a first layer disposed adjacent a substrate. A second layer is disposed adjacent the first layer. A third layer is disposed adjacent the second layer and contains a gap. A fuse is electrically coupled to the third layer and is located proximate the gap in the third layer.

BRIEF DESCRIPTION OF THE DRAWINGS

The systems and methods discussed herein are illustrated by way of example and not limitation in the figures of the accompanying drawings. Similar reference numbers are used throughout the figures to reference like components and/or features.

DETAILED DESCRIPTION

The systems and methods described herein provide a fluid ejection device and method of operation suitable for use with inkjet printing systems and other systems that utilize fluid ejection devices. Although particular examples described herein refer to inkjet printing devices and systems, the systems and methods discussed herein are applicable to any fluid ejection device or component.

Figure 1:
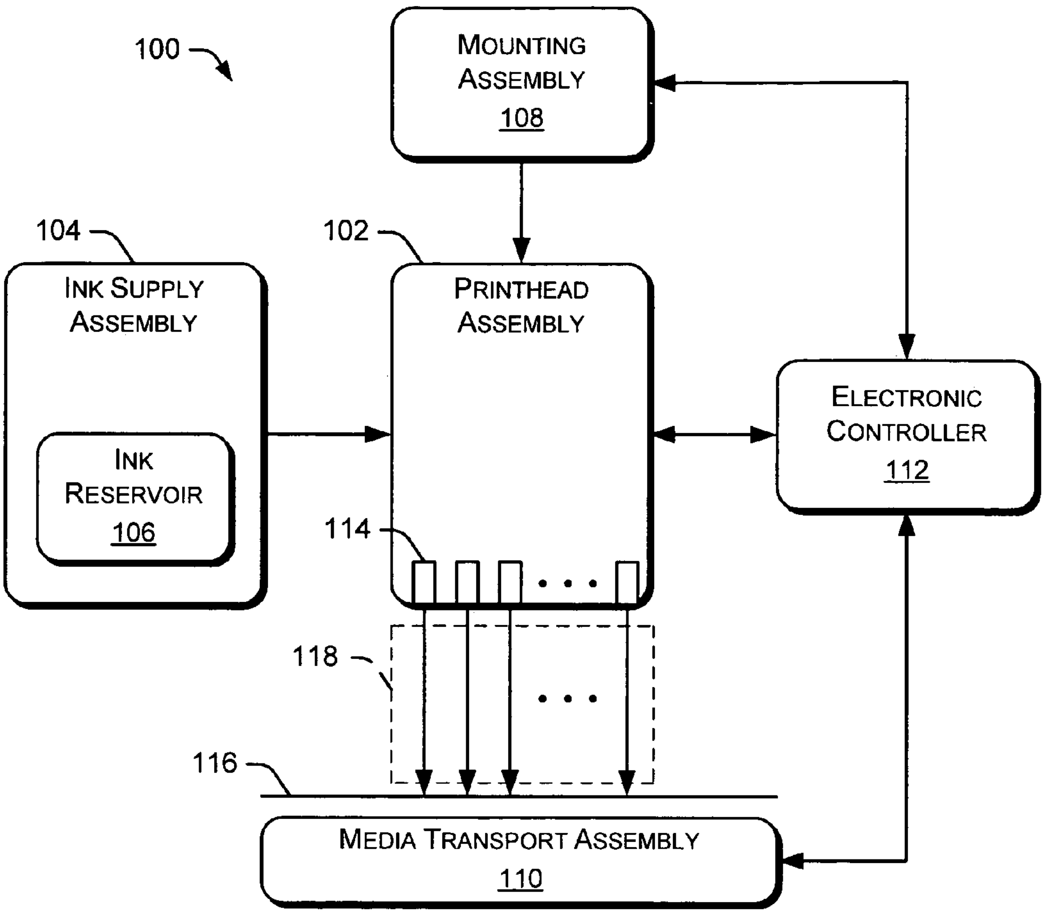
FIG. 1 is a block diagram illustrating an embodiment of an inkjet printing system.

FIG. 1 is a block diagram illustrating an embodiment of an inkjet printing system 100. Inkjet printing system 100 includes a printhead assembly 102, an ink supply assembly 104, a mounting assembly 108, a media transport assembly 110 and an electronic controller 112. Printhead assembly 102 is formed according to an embodiment of the present invention, and includes one or more printheads that eject drops of ink through multiple nozzles 114 and toward a print medium 116 so as to print onto print medium 116. Nozzles 114 may also be referred to as "orifices". Print medium 116 may be any type of material such as paper, card stock, fabric, transparencies, Mylar and the like. Typically, nozzles 114 are arranged in one or more columns (or arrays) such that properly sequenced ejection of ink from nozzles 114 causes characters, symbols, and/or other graphics or images to be printed on print medium 116. In some embodiments, printhead assembly 102 and print medium 116 are moved relative to one another.

Ink supply assembly 104 supplies ink to printhead assembly 102 and includes an ink reservoir 106 that stores ink. Ink flows from ink reservoir 106 to printhead assembly 102. Ink supply assembly 104 and printhead assembly 102 can form either a one-way ink delivery system or a recirculating ink delivery system. In a one-way ink delivery system, substantially all of the ink supplied to printhead assembly 102 is consumed during printing. In a recirculating ink delivery system, only a portion of the ink supplied to printhead assembly 102 is consumed during printing. Ink that is not consumed during printing is returned to ink supply assembly 104.

In one embodiment, printhead assembly 102 and ink supply assembly 104 are housed together in an inkjet cartridge or pen. In another embodiment, ink supply assembly 104 is separate from printhead assembly 102 and supplies ink to printhead assembly 102 through an interface connection, such as a supply tube. In either embodiment, ink reservoir 106 of ink supply assembly 104 may be removed, replaced, or refilled. In one embodiment, where printhead assembly 102 and ink supply assembly 104 are housed together in an inkjet cartridge, ink reservoir 106 includes a local reservoir located within the cartridge as well as a larger reservoir located separately from the cartridge. In this embodiment, the separate, larger reservoir serves to refill the local reservoir. The separate, larger reservoir and/or the local reservoir can be removed, replaced, or refilled.

Mounting assembly 108 positions printhead assembly 102 relative to media transport assembly 110. Media transport assembly 110 positions print medium 116 relative to printhead assembly 102. A print zone 118 is defined adjacent nozzles 114 in an area between printhead assembly 102 and print medium 116. In one embodiment, printhead assembly 102 is a scanning type printhead assembly. In this embodiment, mounting assembly 108 includes a carriage that moves printhead assembly 102 relative to media transport assembly 110 to scan print medium 116. In another embodiment, printhead assembly 102 is a non-scanning type printhead assembly. In this embodiment, mounting assembly 108 fixes printhead assembly 102 at a particular position relative to media transport assembly 110. Media transport assembly 110 positions printhead medium 116 relative to printhead assembly 102.

Electronic controller 112 communicates with printhead assembly 102, mounting assembly 108 and media transport assembly 110. Electronic controller 112 receives data 120 from a host system, such as a computer, and includes memory capable of temporarily storing data 120. Typically, data 120 is sent to inkjet printing system 100 along an electronic, infrared, optical, or other information transfer path. Data 120 represents, for example, a document and/or file to be printed. In one embodiment, data 120 forms a print job for inkjet printing system 100 and includes one or more print job commands and/or command parameters.

In a particular embodiment, electronic controller 112 provides control of printhead assembly 102 including timing control for ejection of ink drops from nozzles 114. Electronic controller 112 defines a pattern of ejected ink drops that form characters, symbols, and/or other graphics or images on print medium 116. Timing control and the pattern of ejected ink drops is determined by, for example, the print job commands and/or command parameters. In one embodiment, logic and drive circuitry forming a portion of electronic controller 112 is incorporated in an integrated circuit (IC) located on printhead assembly 102. In another embodiment, logic and drive circuitry is located off printhead assembly 102.

As discussed above, printhead assembly 102 includes one or more printheads that eject drops of ink. In operations, energy is applied to resistors or other energy-dissipating elements in the printhead, which transfers the energy to ink in one or more nozzles (or orifices) 114 in the printhead. This application of energy to the ink causes a portion of the ink to be ejected out of the nozzle 114 toward the print medium 116. As ink is ejected from the nozzle 14, additional ink is received into the nozzle from the ink supply assembly 104.

Figure 2:
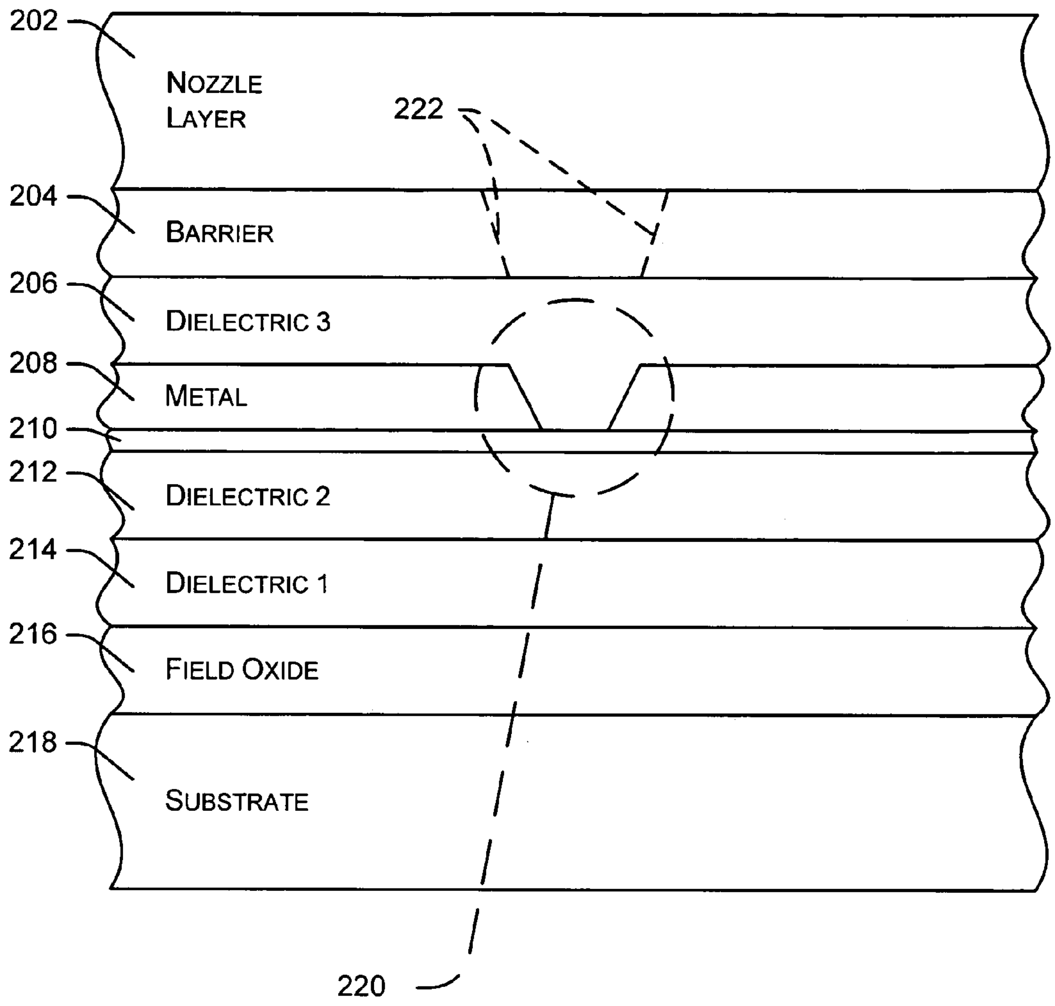
FIG. 2 illustrates a cross-sectional view of an example fuse structure in a PROM that is contained in a printhead.

FIG. 2 illustrates a cross-sectional view of an example fuse structure in a PROM that is contained in a printhead. In a typical embodiment, the PROM contains multiple fuses of the type shown in FIG. 2. The fuse structure includes multiple layers, arranged as shown in FIG. 2. The size (e.g., thickness) of each of the multiple layers shown in FIG. 2 are not drawn to scale. Different layers may have similar or different thicknesses relative to one another. For example, the "Field Oxide" layer and the "Dielectric 1" layer are shown in FIG. 2 as having approximately the same thickness. In a particular embodiment, the thickness of the "Field Oxide" layer and the "Dielectric 1" layer may be similar or may be significantly different.

A top layer 202 shown in FIG. 2 is a nozzle layer, which is located above a barrier layer 204. Nozzle layer 202 contains various nozzles through which ink flows when ejected from the printhead. Nozzle layer 202 is composed of a metal or polymer substance. Barrier layer 204 is generally composed of a polymer material, such as Vacrel, Parad, IJ5000, SU-8, or other suitable polymer materials. The next layer is a dielectric layer 206 composed of SiC (silicon carbide), $Si_3N_4$ (silicon nitride), $SiO_2$ (silicon oxide), or other suitable dielectric materials. A dielectric is a material that is a poor conductor of electrical currents. Barrier layer 204 prevents fluid, such as ink, from contacting a dielectric layer 206 or other layers below dielectric layer 206. Barrier layer 204 includes various channels that route ink to a firing chamber and one or more nozzles.

The next layer is a metal layer 208, such as aluminum. Metal layer 208 has a gap in the middle of the layer that is filled with material from dielectric layer 206. Metal layer 208 may also be referred to as a feed trace layer. Adjacent the metal layer 208 is an electrically resistive layer 210 composed of TaAl (tantalum aluminum). Alternatively, resistive layer 210 may be composed of polysilicon, WSiN (tungsten silicon nitride), or another electrically conductive material that generates, during conduction, an appropriate amount of heat to eject fluids. The metal layer 208 is electrically coupled to the resistive layer 210 such that electrical current can flow between the metal layer and the resistive layer.

Adjacent the resistive layer 210 is another dielectric layer 212 made from $SiO_2$. The next layer is yet another dielectric layer 214 composed of USG (undoped silicon glass) or BPSG (boron-phosphorous doped glass), both of which are a form of silicon oxide. Adjacent to dielectric layer 214 is a field oxide layer 216. Field oxide layer 216 may also be referred to as an "electrical isolation layer" or a "thermal isolation layer". The last layer illustrated in FIG. 2 is a substrate 218 composed of silicon. The field oxide layer 216 is a form of $SiO_2$ that provides electrical and thermal isolation between substrate 218 and dielectric layer 214.

The actual fuse portion of FIG. 2 is highlighted by broken line 220. When the fuse is a closed circuit (i.e., allowing electrical current to flow through the fuse), the fuse appears as shown in FIG. 2. Electrical current is conducted by the metal layer 208, until the current reaches the gap in the metal layer. When the fuse allows electrical current to flow through the fuse, the electrical current flows "across" the gap in the metal layer 208 by flowing through the resistive layer 210. Thus, electrical current flows across the metal layer 208 when the fuse is a closed circuit (e.g., not blown or burned). However, if the fuse is blown, the resistive layer 210 is damaged in the vicinity of the gap in the metal layer 208 such that the resistive layer does not allow electrical current to flow "across" the gap in the metal layer.

The fuse shown in FIG. 2 can be blown by applying an electrical voltage of sufficient strength and duration to damage the resistive layer 210 such that the resistive layer is no longer capable of conducting electrical current. The fuse is blown by applying the electrical voltage to metal layer 208 such that a voltage is applied across the fuse. When an appropriate voltage is applied for a sufficient duration of time, the fuse is blown (or burned). Thus, the fuse is capable of storing a single bit of information (e.g., a logic "one" if the fuse is blown and a logic "zero" if the fuse is not blown, or vice versa).

When attempting to blow the fuse shown in FIG. 2, if the barrier layer 204 above the fuse is solid, the fuse may not blow properly because the solid material in the barrier layer blocks at least a portion of the physical expansion of the resistive layer 210 during the fuse blowing process. To improve the likelihood that the fuse of FIG. 2 will be blown properly, the fuse can be blown prior to applying the barrier layer 204. Alternatively, a hole (indicated by broken lines 222) may be created in the barrier layer 204 prior to blowing the fuse. The hole in the barrier layer 204 provides a space for physical expansion of the resistive layer 210 and the dielectric layer 206 when the fuse is blown. The barrier layer hole may be larger, smaller, or the same size as the gap in the metal layer 208. The hole in the barrier layer 204 is positioned approximately vertically above the gap in the metal layer 208.

The barrier layer hole increases the possibility that ink in the printhead, when the printhead is operational, will come in contact with the fuse. For example, ink may flow through the hole in the barrier layer, through the dielectric layer 206 (which was damaged due to the fuse blowing process) and come in contact with the previously blown fuse. This ink contact may cause a short-circuit, thereby causing the blown fuse to appear as a closed circuit (i.e., a fuse that has not been blown).

Figure 3:
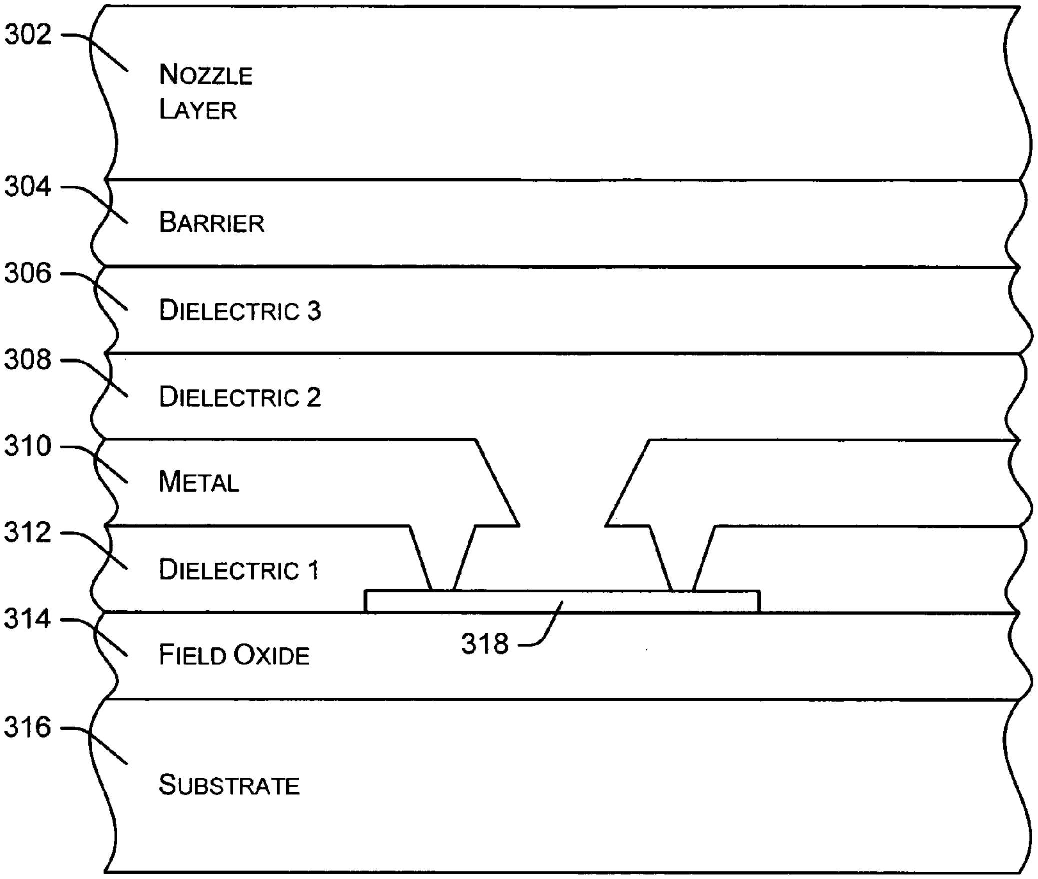
FIG. 3 illustrates a cross-sectional view of an embodiment of a fuse structure in a PROM that is contained in a printhead.

FIG. 3 illustrates a cross-sectional view of an embodiment of a fuse structure in a PROM that is contained in a printhead. This fuse structure also has multiple layers, arranged as shown in FIG. 3. The size (e.g., thickness) of each of the multiple layers shown in FIG. 3 are not drawn to scale. Different layers may have similar or different thicknesses relative to one another. For example, the "Field Oxide" layer and the "Dielectric 3" layer are shown in FIG. 3 as having approximately the same thickness. In a particular embodiment, the thickness of the "Field Oxide" layer and the "Dielectric 3" layer may be similar or may be significantly different. Various layers shown in FIG. 3 may also be referred to as "films" or "thin films".

The structure shown in FIG. 3 includes a nozzle layer 302 (also referred to as an orifice plate) composed of a metal or polymer substance. Kapton and nickel plated with a thin layer of platinum are common nozzle layer materials. The nozzle layer 302 is located above a barrier layer 304. The barrier layer 304 is composed of a polymer material such as Vacrel, Parad, IJ5000, or SU-8. The next layer is a dielectric layer 306 composed of $T_6O_5$, SiC, $Si_3N_4$, $SiO_2$, or other suitable dielectric materials. Below the dielectric layer 306 is another dielectric layer 308 composed of $T_6O_5$ or other suitable dielectric materials. Although FIG. 3 shows dielectric layers 306 and 308 as separate layers, in alternate embodiments, the two layers can be merged into a single layer. Barrier layer 304 prevents fluid, such as ink, from contacting a dielectric layer 306 or other layers below dielectric layer 306. Barrier layer 304 includes various channels that route ink to a firing chamber and one or more nozzles.

The next layer is a metal layer 310, composed of a material such as aluminum. The metal layer 310 has a gap in the middle of the layer that is filled with material from dielectric layer 308. Adjacent the metal layer 310 is another dielectric layer 312 composed of, for example, USG or BPSG. This dielectric layer 312 has a gap in the middle of the layer that is filled with material from metal layer 310 and dielectric layer 308. Additionally, the dielectric layer 312 gap is partially filled with a fuse 318 (also referred to as a "fuse layer" or a "resistive layer"). Fuse 318 may also be referred to as a "fusible link". In one embodiment, fuse 318 is composed of polysilicon doped with phosphorous. In alternate embodiments, fuse 318 may be composed of polysilicon doped with arsenic or boron. In other embodiments, fuse 318 may be composed of undoped polysilicon. In another embodiment, fuse 318 is composed of tantalum (Ta), tantalum aluminum (TaAl), or WSiN. In one embodiment, the material used in fuse 318 is typically different from the material used in resistive layer 210 of FIG. 2, discussed above.

The metal layer 310 is electrically coupled to the fuse 318 such that electrical current can flow between the metal layer and the fuse. As shown in FIG. 3, although fuse 318 is electrically coupled to metal layer 310, the fuse is positioned in a different layer than the metal layer.

Adjacent the dielectric layer 312 is a field oxide layer 314 that provides electrical and thermal isolation between a substrate 316 and dielectric layer 312 where fuse 318 is located. Field oxide layer 314 may also be referred to as an "electrical isolation layer" or a "thermal isolation layer". The last layer illustrated in FIG. 3, the substrate 316, is composed of silicon.

When the fuse 318 is a closed circuit (i.e., allowing electrical current to flow through the fuse), the fuse appears as shown in FIG. 3. Electrical current is conducted by the metal layer 310, until the current reaches the gap in the metal layer. When the fuse allows electrical current to flow through the fuse, the electrical current flows "across" the gap in the metal layer 310 by flowing through the fuse 318. Thus, electrical current flows across the metal layer 310 when the fuse is a closed circuit (e.g., not burned or blown). However, if the fuse is blown, the fuse 318 is damaged in the vicinity of the gap in the metal layer 310 such that the fuse does not allow electrical current to flow "across" the gap in the metal layer.

The fuse 318 shown in FIG. 3 can be blown by applying an electrical voltage of sufficient strength and duration to damage the fuse such that the fuse is no longer capable of conducting electrical current. Thus, the fuse 318 is capable of storing a single bit of information (e.g., a logic "one" if the fuse is blown and a logic "zero" if the fuse is not blown, or vice versa).

In one embodiment, the process of blowing fuse 318 includes applying an electrical voltage of 26 volts across the fuse until the fuse blows. Completion of the fuse blowing process can be determined, for example, by identifying a drop in the current flowing from the electrical source generating the 26 volts that are applied across the fuse. This drop in current flow indicates an open circuit caused by the blown fuse. In one embodiment, a polysilicon fuse doped with phosphorous will blow in approximately 30 microseconds with the application of 26 volts across the fuse. The voltage and the time required to blow a particular fuse may vary depending on various factors, such as the size, shape, position and composition of the particular fuse.

In the embodiment of FIG. 3, the fuse 318 is positioned farther from the barrier layer 304 and closer to the substrate 316 than the fuse structure shown in FIG. 2. In one embodiment, the fuse 318 is composed of polysilicon doped with phosphorous instead of TaAl as used in resistive layer 210. These differences (alone or in combination) allow fuse 318 to be blown properly without requiring that a hole be created in the barrier layer 304 above the fuse. This happens, for example, due to greater room for expansion of fuse 318 in dielectric layer 312 than in metal layer 310. Thus, the embodiment of FIG. 3 allows the fuses in a PROM to be covered with a solid barrier layer that protects blown fuses from possible short circuits due to ink coming in contact with the fuse.

The structure shown in FIG. 3 positions the fuse 318 such that dielectric layers 306 and 308 are located above the fuse. This change allows for greater thermal diffusion of the heat generated by the fuse blowing process, which minimizes thermal interference by the barrier layer 302. Since blowing a fuse generates heat, that heat is absorbed by the surrounding material(s) of the surrounding layer(s). The fuse structure shown in FIG. 3 is closer to the substrate, which is a good conductor of thermal energy. Thus, the substrate helps dissipate a certain amount of thermal energy that might otherwise be absorbed by materials of the layers located above the fuse ("above" the fuse based on the orientation shown in FIG. 3), e.g., the dielectric layers 306 and 308, and the barrier layer 304. If too much thermal energy is absorbed by materials above the fuse, the temperatures of those materials may rise to a point that the heat damages (e.g., decomposes) those materials, thereby increasing the possibility of device malfunction. Thus, the fuse structure shown in FIG. 3 reduces the likelihood of damage to layers surrounding the fuse without requiring a hole in the barrier layer.

The structure shown in FIG. 3 represents an example structure. Alternate embodiments may include different layer arrangements, different fuse sizes, different fuse positions within the layer or within other dielectric layers, and the like. Further, the shape, size and/or position of the gap in the metal layer 310 may change in alternate embodiments.

Figure 4:
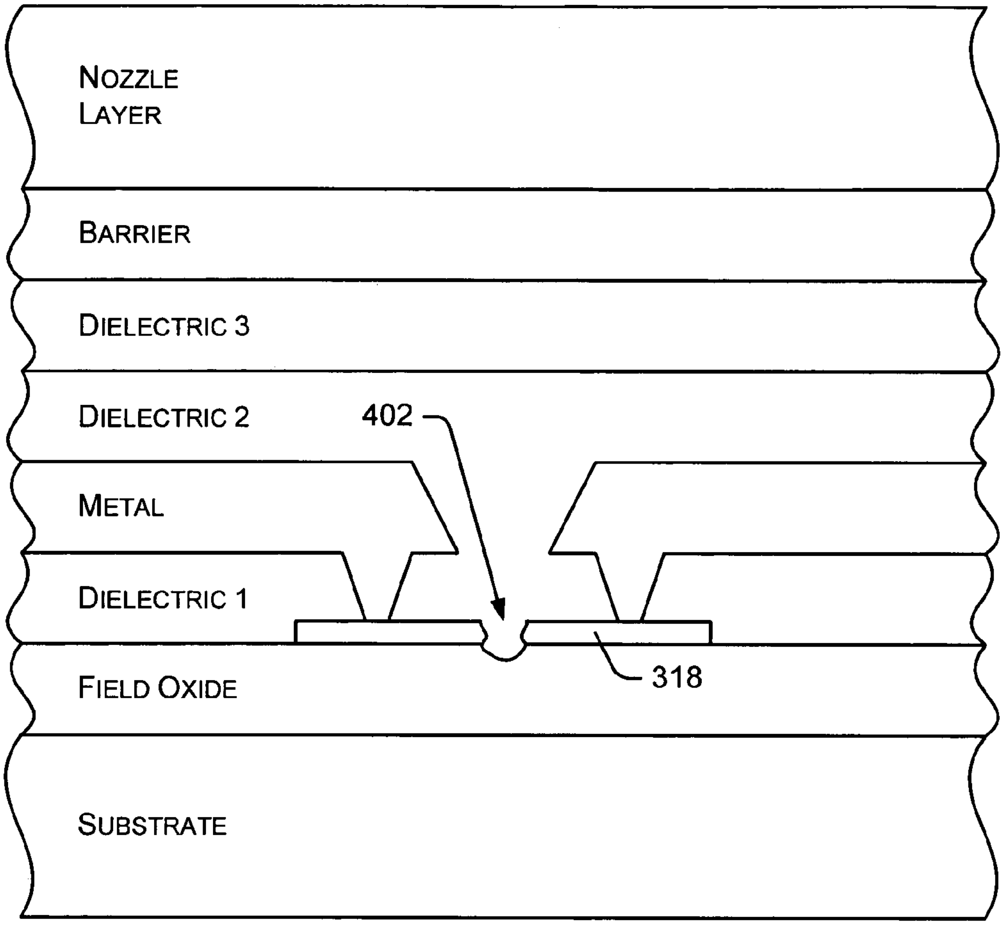
FIG. 4 illustrates a cross-sectional view of the embodiment of the fuse structure shown in FIG. 3 after the fuse has been blown.

FIG. 4 illustrates a cross-sectional view of the embodiment of the fuse structure shown in FIG. 3 after fuse 318 has been blown. After being blown, fuse 318 has been physically damaged such that the fuse is no longer capable of conducting electrical current. In particular, a gap 402, which is filled by dielectric material from dielectric layers 308 and/or 312, located in fuse 318 is formed where a portion of the fuse material was previously located. This gap is created due to the thermal energy applied to fuse 318 during the fuse blowing process. Electrical current cannot flow across this gap 402.

Figure 5:
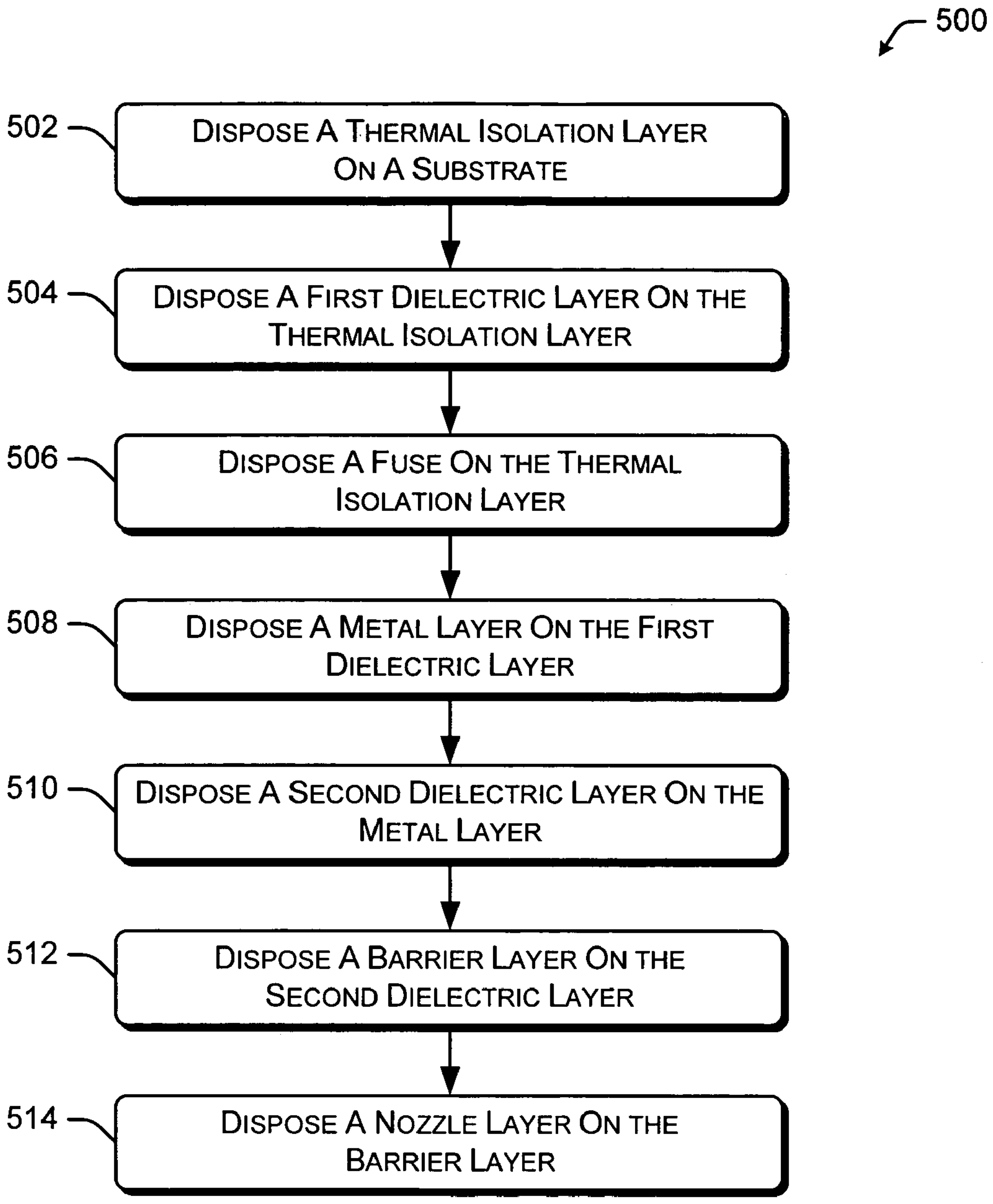
FIG. 5 is a flow diagram illustrating an embodiment of a procedure for creating a fuse structure that can be used in a printhead or other device.

FIG. 5 is a flow diagram illustrating an embodiment of a procedure 500 for creating a fuse structure for use in a printhead or other device. Initially a thermal isolation layer is disposed on a substrate (block 502). As used herein, disposing one layer on another layer (or substrate) can be accomplished using a variety of techniques. For example, one layer may be bonded to another layer, or deposited on another layer. Next, a first dielectric layer is disposed on the thermal isolation layer (block 504). A fuse is also disposed on the thermal isolation layer (block 506). A metal layer is then disposed on the first dielectric layer (block 508) such that the metal layer is electrically coupled to the fuse. Additionally, the metal layer is formed such that a gap exists in the metal layer near the fuse. The fuse provides an electrically conductive path across this gap.

Process 500 continues by disposing a second dielectric layer on the metal layer (block 510). A barrier layer is then disposed on the second dielectric layer (block 512) and a nozzle layer is disposed on the barrier layer (block 514). Process 500 represents one example of a process for creating a fuse structure. In alternate embodiments, one or more operations may be omitted from process 500. Further, alternate embodiments may include one or more additional operations not shown in process 500.

As mentioned above, the fuse structure created by process 500 can be used in a printhead or other device. In other devices, one or more of the operations in process 500 may be omitted. For example, disposing a barrier layer (block 512) and disposing a nozzle layer (block 514) may not be necessary if the fuse structure is not intended for a fluid ejection device, such as a printhead. In other embodiments, different operations in process 500 may be omitted and/or other operations may be added.

Figure 6:
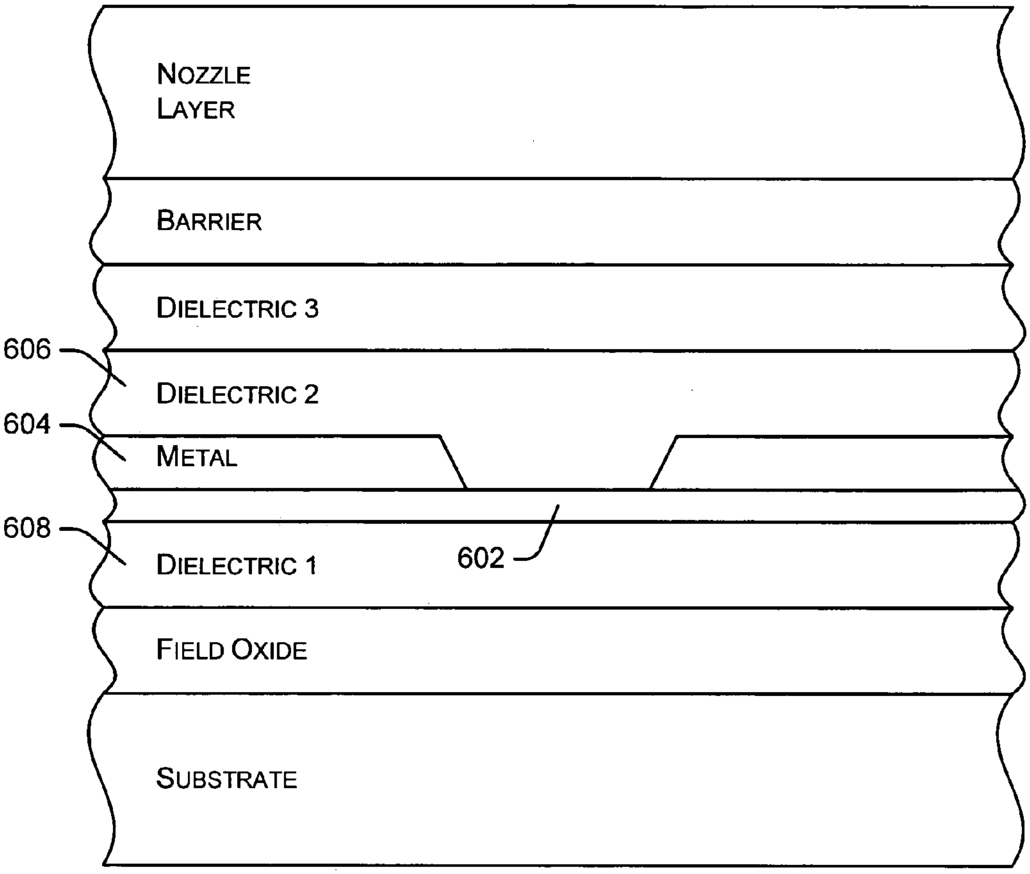
FIG. 6 illustrates a cross-sectional view of another embodiment of a fuse structure in a PROM that is contained in a fluid ejection device.

FIG. 6 illustrates a cross-sectional view of another embodiment of a fuse structure in a PROM that is contained in a fluid ejection device. In this embodiment, a fuse 602 is located adjacent a metal layer 604. Fuse 602 fills a gap in the metal layer 604. Fuse 602 and metal layer 604 are positioned between two dielectric layers 606 and 608. The remaining layers shown in FIG. 6 are similar to those discussed above with respect to FIG. 3.

In one embodiment, fuse 602 is composed of polysilicon doped with phosphorous and metal layer 604 is composed of aluminum. Fuse 602 may alternatively be composed of other materials, such as those discussed with respect to FIG. 3 regarding fuse 318. Metal layer 604 is electrically coupled to fuse 602 such that electrical current can flow between the metal layer and the fuse. When fuse 602 has not been blown, electrical current flows “across” the gap in metal layer 604 via fuse 602. However, when fuse 602 is blown, the fuse is damaged such that the fuse does not allow electrical current to flow “across” the gap in metal layer 604. Fuse 602 can be blown by applying an electrical voltage of sufficient strength and duration to damage the fuse such that the fuse is no longer capable of conducting electrical current.

Although particular examples of fuse structures have been discussed herein, alternate embodiments may include different configurations, arrangements, and positions of various layers and components (e.g., fuses) in the structure. For example, a fuse may be located above the gap in the metal layer, below the gap in the metal layer, or substantially coplanar with the gap in the metal layer. Further, the shape and/or size of the gap may vary as well as the shape and/or size of the fuse.

The systems and methods discussed herein are applicable to any type of printhead or other fluid ejection device. Further, these systems and methods can be applied to various types of fuses, fuse structures and related devices.

Although the description above uses language that is specific to structural features and/or methodological acts, it is to be understood that the method and apparatus for data reconstruction defined in the appended claims is not limited to the specific features or acts described. Rather, the specific features and acts are disclosed as exemplary forms of implementing the systems and methods described herein.

What is claimed is:

1. A printhead comprising:

a substrate;

a first layer disposed adjacent the substrate;

a second layer disposed adjacent the first layer;

an electrically conductive third layer disposed adjacent the second layer, wherein the third layer contains a gap;

a fuse disposed between the third layer and the first layer, wherein the fuse is electrically coupled to the third layer, and wherein the fuse is located proximate the gap in the third layer;

a dielectric layer disposed adjacent the third layer; and a fluid barrier layer disposed adjacent the dielectric layer.

2. The printhead of claim 1, wherein the fuse is a programmable fuse.

3. The printhead of claim 1, wherein the fuse is composed of polysilicon doped with phosphorous.

4. The printhead of claim 1, wherein the fuse is composed of tantalum aluminum.

5. The printhead of claim 1, wherein the fuse is composed of WSiN.

6. The printhead of claim 1, wherein the third layer is composed of aluminum.

7. The printhead of claim 1, wherein the fuse provides an electrically conductive path across the gap in the third layer.

8. The printhead of claim 1, wherein electrical conductivity of the fuse can be substantially eliminated by applying a voltage across the fuse for a predetermined time period.

9. A printhead comprising:

a substrate;

a thermal isolation layer adjoining the substrate;

a first dielectric layer adjoining the thermal isolation layer;

a metal layer adjoining the first dielectric layer;

a fuse disposed in the first dielectric layer and electrically coupled to the metal layer;

a second dielectric layer adjoining the metal layer opposite the first dielectric layer; and a fluid barrier layer adjoining the second dielectric layer to prevent fluid from contacting the metal layer.

10. The printhead of claim 9, wherein the metal layer contains a gap proximate the fuse and wherein the gap is filled with material from the second dielectric layer.

11. The printhead of claim 9, wherein the metal layer contains a gap proximate the fuse and wherein the fuse provides an electrically conductive path across the gap.

12. The printhead of claim 9, wherein the second dielectric layer includes a layer of a first dielectric material and a layer of a second dielectric material.

13. The printhead of claim 9, wherein the fluid barrier layer prevents fluid from contacting the second dielectric layer.

14. The printhead of claim 9, wherein the fuse is composed of polysilicon doped with phosphorous.

15. The printhead of claim 9, wherein the fuse is a programmable fuse composed of tantalum aluminum.

16. The printhead of claim 9, wherein the fuse is a programmable fuse composed of WSiN.

17. An apparatus as recited in claim 9, wherein the metal layer is composed of aluminum.

18. A method of generating a fuse structure, the method comprising:

disposing a thermal isolation layer on a substrate;

disposing a first dielectric layer on the thermal isolation layer;

disposing a fuse on the thermal isolation layer, wherein the fuse is separated from the substrate by the thermal isolation layer;

disposing a metal layer on the first dielectric layer wherein the metal layer is electrically coupled to the fuse;

disposing a second dielectric layer on the metal layer;

disposing a barrier layer on the second dielectric layer; and disposing a nozzle layer on the barrier layer.

19. A method as recited in claim 18, wherein the fuse material is polysilicon doped with phosphorous.

20. A method as recited in claim 18, wherein disposing a metal layer on the first dielectric layer includes forming a gap in the metal layer in an area proximate the fuse.

21. A method as recited in claim 18, wherein disposing a metal layer on the first dielectric layer includes forming a gap in the metal layer in an are proximate the fuse, and wherein the fuse provides an electrically conductive path across the gap.

22. An inkjet printing system including a printhead configured to eject printing fluid, the printhead comprising:

a substrate;

a thermal isolation layer disposed adjacent the substrate;

a first dielectric layer disposed adjacent the thermal isolation layer;

a metal layer disposed adjacent the first dielectric layer;

a fuse electrically coupled to the metal layer to provide an electrically conductive path across a gap in the metal layer, the fuse being disposed between the thermal isolation layer and the first dielectric layer to accommodate expansion of the fuse upon blowing of the fuse;

a second dielectric layer disposed adjacent the metal layer opposite the first dielectric layer;

a printing fluid barrier layer disposed adjacent the second dielectric layer and opposite the metal layer to prevent printing fluid from contacting the metal layer; and a nozzle layer disposed adjacent the barrier layer to accommodate ejection of printing fluid from the printhead.

* * * * *

UNITED STATES PATENT AND TRADEMARK OFFICE

CERTIFICATE OF CORRECTION

PATENT NO. : 6,946,718 B2
APPLICATION NO. : 10/751710
DATED : September 20, 2005
INVENTOR(S) : Victorio Chavarria It is certified that error appears in the above-identified patent and that said Letters Patent is hereby corrected as shown below:

In column 9, line 23, in Claim 17, delete "An apparatus as recited in" and insert -- The printhead of --, therefor.

In column 10, line 11, in Claim 21, delete "are" and insert -- area --, therefor.

Signed and Sealed this

First Day of September, 2009

David J. Kappos
*Director of the United States Patent and Trademark Office*